(12) United States Patent
Zhu

(10) Patent No.: US 11,791,829 B2
(45) Date of Patent: Oct. 17, 2023

(54) DIGITAL PHASE-LOCKED LOOP WITH FAST OUTPUT FREQUENCY DIGITAL CONTROL

(71) Applicant: Morse Micro Pty. LTD., Surry Hills (AU)

(72) Inventor: Yingbo Zhu, Surry Hills (AU)

(73) Assignee: Morse Micro Pty. LTD., Surry Hills (AU)

( * ) Notice: Subject to any disclaimer, the term of this patent is extended or adjusted under 35 U.S.C. 154(b) by 0 days.

(21) Appl. No.: 17/678,319

(22) Filed: Feb. 23, 2022

(65) Prior Publication Data

US 2022/0271761 A1 Aug. 25, 2022

(51) Int. Cl.
| | |
|---|---|
| H03L 7/00 | (2006.01) |
| H03L 7/099 | (2006.01) |
| H03L 7/089 | (2006.01) |
| H03L 7/187 | (2006.01) |
| H03L 7/083 | (2006.01) |

(52) U.S. Cl.
CPC ............ H03L 7/0991 (2013.01); H03L 7/083 (2013.01); H03L 7/089 (2013.01); H03L 7/187 (2013.01)

(58) Field of Classification Search
CPC ..... H03L 7/00; H03L 7/06; H03L 7/08; H03L 7/083; H03L 7/099; H03L 7/0991
USPC .......... 375/373–376; 327/147, 150, 156, 159
See application file for complete search history.

(56) References Cited

U.S. PATENT DOCUMENTS

| | | | |
|---|---|---|---|
| 6,326,851 | B1 | 12/2001 | Staszewski et al. |
| 6,359,950 | B2 | 3/2002 | Gossmann et al. |
| 7,567,101 | B2 | 7/2009 | Yojozeki |
| 7,688,929 | B2 | 3/2010 | Co |
| 7,809,345 | B2 | 10/2010 | May |
| 8,432,199 | B2 | 4/2013 | Lee et al. |
| 9,705,515 | B1 * | 7/2017 | Lee .......................... H03L 7/093 |
| 11,456,750 | B2 * | 9/2022 | Lin ........................ H03L 7/1976 |

* cited by examiner

*Primary Examiner* — Hai L Nguyen
(74) *Attorney, Agent, or Firm* — CP LAW GROUP PC; Cy Bates

(57) ABSTRACT

The present disclosure is directed to a digital phase-locked loop frequency synthesizer including: a digitally controlled voltage-controlled oscillator (DCO); a reference oscillator; a digital phase detector; a DCO control module comprising a plurality of registers each arranged to control the frequency of the signal with a predetermined resolution; a first feedback loop arranged to provide a first feedback path between the output of the DCO and the digital phase detector; and a second feedback loop arranged to provide a second feedback path between the first register output and the second register input, the second feedback loop comprising an adder module arranged to change a value of the second register based on the first register output to maximize a DCO frequency output range provided by the first register.

13 Claims, 7 Drawing Sheets

200

```
┌─────────────────────────────────────────────────────────────┐
│ 202 – Monitoring the output of the TCK register             │
└─────────────────────────────────────────────────────────────┘
                              │
                              ▼
┌─────────────────────────────────────────────────────────────┐
│ 204 – Filtering the output through an LPF filter            │
└─────────────────────────────────────────────────────────────┘
                              │
                              ▼
┌─────────────────────────────────────────────────────────────┐
│ 206 – Increase or decrease the value of the                 │
│ ACQ register based on the monitoring of the                 │
│ output of the TCK register in a manner such                 │
│ that the target frequency resides approximately             │
│ in the middle of the TCK range                              │
└─────────────────────────────────────────────────────────────┘
```

FIG.2

DIGITAL PHASE-LOCKED LOOP WITH FAST OUTPUT FREQUENCY DIGITAL CONTROL

FIELD OF THE INVENTION

The present invention relates to a digital phase-locked loop (DPLL) circuit. More specifically, the present invention pertains to a DPLL frequency synthesizer circuit with a fast output frequency digital control that can be used for frequency modulation.

BACKGROUND

A DPLL circuit (or ADPLL) is a PLL circuit in which all parts of the loop are made using digital electronic modules. DPLLs are more stable and reliable than their analogue counterparts as they do not fully rely on a voltage-controlled oscillator (VCO) that can introduce frequency drift.

A conventional multiplier type DPLL circuit comprises a control oscillator made up of a frequency divider that frequency-divides at the prescribed frequency division ratio of a master clock, which has a frequency sufficiently higher than that of the input reference clock to generate an output clock, a frequency divider for feedback that frequency-divides at a frequency division ratio corresponding to the multiplier for the output clock output from said control oscillator and generates a feedback clock at a frequency equal to that of the reference clock, and a phase comparator that compares the phase of the reference clock and the feedback clock and generates a synchronization control signal for controlling the locking operation of the control oscillator.

Phase locking in the control oscillator is realized with the reference clock by controlling the counter operating frequency at high speed, low speed, or intermediate speed with respect to the master clock corresponding to the synchronization control signal from the phase comparator, that is, corresponding to the phase difference between the reference clock and the feedback clock.

One of the issues with conventional DPLL circuits is that tracking of phase differences between the reference clock and the feedback clock or the synchronization control signal from the phase comparator is limited. In particular, the counter operating frequency has a narrow range, so that the lock range is limited.

SUMMARY OF THE INVENTION

In accordance with a first aspect, the present invention provides, a digital phase-locked loop (DPLL) frequency synthesizer comprising:
- a digitally controlled voltage-controlled oscillator (DCO) having an input and an output, the output configured to produce a signal with a frequency;
- a reference oscillator arranged to provide a reference frequency;
- a digital phase detector arranged to compare a target frequency with the frequency of the output of the DCO;
- a DCO control module comprising a plurality of registers each arranged to control the frequency of the signal with a predetermined resolution, the plurality of registers including a first register having a first register output and a second register having a second register input;
- a first feedback loop arranged to provide a first feedback path between the output of the DCO and the digital phase detector; and
- a second feedback loop arranged to provide a second feedback path between the first register output and the second register input, the second feedback loop comprising an adder module arranged to change a value of the second register based on the first register output to maximize a DCO frequency output range provided by the first register.

In an embodiment, the DPLL further comprises a digital loop filter arranged to process a difference signal of the digital phase detector and produce a control signal.

In an embodiment, the DCO control module comprises a PVT register, an ACQ register, and a TCK register wherein each of the PVT, register, ACQ register, and TCK register has a range and is configured to encode a digital word controlling the frequency of the output signal of the DCO with a specific resolution.

In an embodiment, the PVT register is an 8-bit register used for coarse frequency control, the ACQ register is an 8-bit register used for fine frequency control and the TCK register is a 9-bit register used for precise frequency control.

In an embodiment, the first register is the TCK register, and the second register is the ACQ register.

In an embodiment, the adder circuit is arranged to modify a value of the ACQ register when the TCK register is approaching a boundary of the range of the TCK register in order to keep the TCK register in proximity of the middle of the range of the TCK register.

In an embodiment, the feedback module is arranged to convert the frequency of the DCO output signal into a digital code (FFC) for comparison in the digital phase detector.

In an embodiment, the DPLL further comprises a polar encoder arranged to control a value of one of the plurality of registers to directly control the frequency of the output of the DCO for polar encoding.

In accordance with the second aspect, the present invention provides a method for performing polar modulation using a digital phase-locked loop (DPLL) frequency synthesizer comprising:
providing a DPLL, the DPLL comprising:
- a digitally controlled voltage-controlled oscillator (DCO) having an input and an output, the output configured to produce a signal with a frequency;
- a reference oscillator arranged to provide a reference frequency;
- a digital phase detector arranged to compare a target frequency with the frequency of the output of the DCO;
- a DCO control module comprising a plurality of registers each arranged to control the frequency of the signal with a predetermined resolution, the plurality of registers including a first register having a first register output and a second register having a second register input;
- a first feedback loop arranged to provide a first feedback path between the output of the DCO and the digital phase detector; and
- a second feedback loop arranged to provide a second feedback path between the first register output and the second register input, the second feedback loop comprising an adder module arranged to change a value of the second register based on the first register output to maximize a DCO frequency output range provided by the first register;

providing a polar encoder and operatively connecting the polar encoder to the one of the plurality of registers to directly control the frequency of the output of the DCO for polar encoding; and operatively connecting the polar encoder to the digital phase detector to provide the digital phase detector with a target frequency for polar encoding.

In an embodiment, the DPLL further comprises a digital loop filter arranged to process a difference signal of the digital phase detector and produce a control signal.

In an embodiment, the DCO control module comprises a PVT register, an ACQ register, and a TCK register wherein each of the PVT, register, ACQ register, and TCK register has a range and is configured to encode a digital word controlling the frequency of the output signal of the DCO with a specific resolution.

In an embodiment, the PVT register is an 8-bit register used for coarse frequency control, the ACQ register is an 8-bit register used for fine frequency control and the TCK register is a 9-bit register used for precise frequency control.

In an embodiment, the first register is the TCK register, and the second register is the ACQ register.

In an embodiment, the adder circuit is arranged to modify a value of the ACQ register when the TCK register is approaching a boundary of the range of the TCK register to keep the TCK register in proximity of the middle of the range of the TCK register.

In an embodiment, the feedback module is arranged to convert the frequency of the DCO output signal into a digital code (FFC) for comparison in the digital phase detector.

Advantages of embodiments of this disclosure allow to precisely control the output of the DCO without having to go through a full relocking loop of the DPLL. In turns, this enables a number of applications for the DPLL circuit disclosed, such as polar encoding of digitally modulated signals.

BRIEF DESCRIPTION OF THE DRAWINGS

For proper understanding of the invention, reference should be made to the accompanying drawings, wherein:

FIG. 2 shows a flow diagram that outlines the steps followed to maximise the DPLL output frequency dynamic range in accordance with embodiments;

DETAILED DESCRIPTION OF THE INVENTION

Figure 1A:
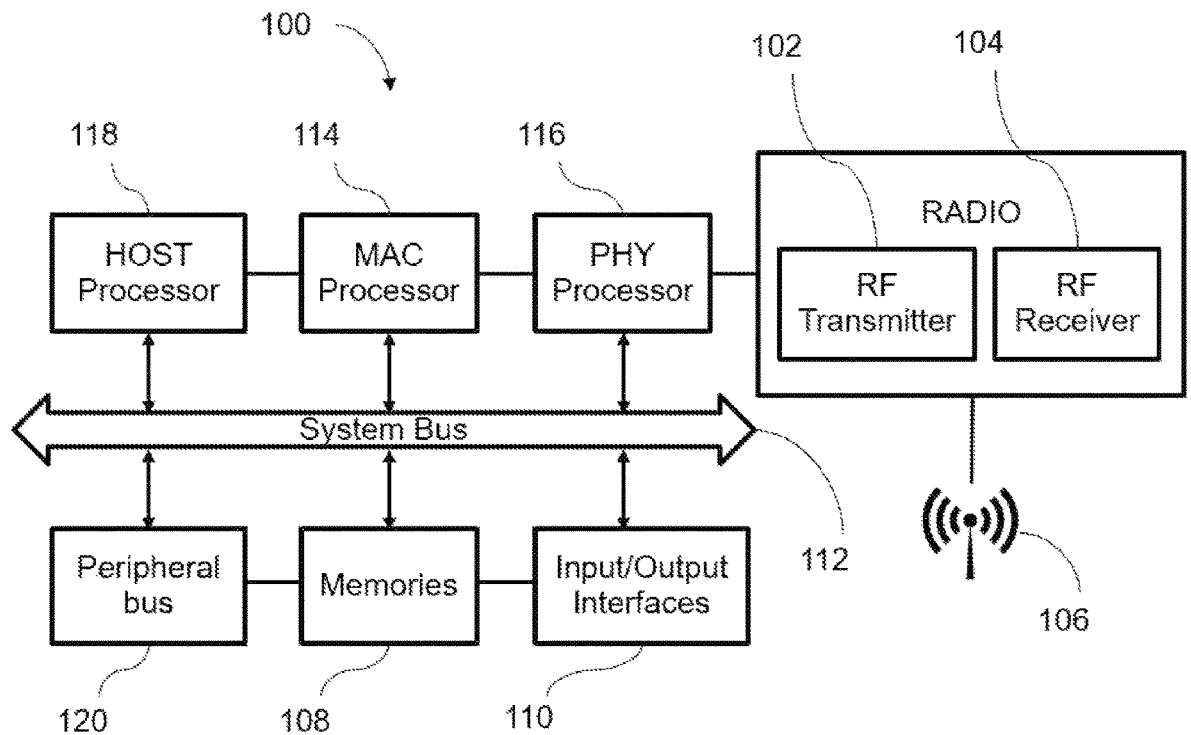
FIG. 1A shows a high-level block diagram of a WLAN device and a receiver data flow architecture used to receive Wi-Fi packets over the network.

Modern wireless local area networks (WLANs), such as WLANs based on the IEEE 802.11n, 802.11ac, 802.11ax and 802.11ah use orthogonal frequency-division multiplexing (OFDM) to encode signals at the physical (PHY) level.

For purposes herein, the term "WLAN", or wireless LAN, means a wireless computer network that links two or more devices using wireless communication to form a local area network (LAN) within a limited area.

The term "Physical (PHY) processor" means processing hardware capable of implementing functions of the PHY layer of the IEEE802.11 standard to interface with the wireless medium.

The term "Media Access Control (MAC) processor" means processing hardware capable of implementing functions of the MAC layer of the IEEE802.11 standard.

The term "PHY Protocol Data Unit (PPDU)" means basic unit of information transmitted over the network at the PHY level.

The term "wireless receiving station (STA)" means a networking device capable of communicating with an access point over a wireless network.

The term "access point (AP)" means a networking device capable of communicating with several client devices (stations) over a wireless network and capable to interface with a wired network. For example, an 802.11 Wi-Fi access point.

The term "sleep-clients" means devices that share the platform with the WLAN device that require access to the WLAN device to perform their functions. For example, these devices may need to send data over the wireless medium.

The term "memory banks" means any form of digital memory for storing digital information.

The term "input and output interfaces" means hardware or software data exchange means for transferring data to and from electronic devices. For example, digital data exchange or diagnostic serial buses, such as GPIO bus or USB.

The term "short training field (STF)" means a field of the IEEE802.11 family of standards that includes a small number of samples that facilitate signal synchronization.

The term "long training field (LTF)" means a field of the IEEE802.11 family of standards that includes a larger number of samples that facilitate signal synchronization.

The term "correlation peak" means a peak in the output signal of a correlator module.

The term "STF correlation peak or STF peak" means a correlation peak from a correlator based on input signals related to STF samples.

The term "DPLL" and "ADPLL" mean digital phase locking loop and all digital phase locking loop respectively and related to digital circuits that generate an oscillating signal with a controlled frequency withing a given frequency range.

OFDM is a technique used to modulate information over multiple carriers. In OFDM systems, at the transmitter side, an Inverse Fast Fourier Transform (IFFT) is applied to create an OFDM symbol, and a cyclic prefix is appended to the start of an OFDM symbol. At the receiver, the cyclic prefix is removed, and a Fast Fourier Transform (FFT) is applied to the received OFDM symbol. The length of the cyclic prefix is designed to be larger than the span of the multipath channel. The portion of the cyclic prefix which is corrupted due to the multipath channel from the previous samples is known as the inter-symbol interference (ISI) region. The remaining part of the cyclic prefix which is not affected by the multipath channel is known as the ISI-free region.

FIG. 1A shows a high-level block diagram of a WLAN device 100 implementing a STA or AP according to some embodiments. Each of the network devices manages a MAC layer and a PHY layer in accordance with IEEE 802.11.

WLAN device 100 includes a radio frequency (RF) transmitter module 102, an RF receiver module 104, an antenna unit 106, one or more memory banks 108, input and output interfaces 110 and communication bus 112. Furthermore, the device 100 includes a MAC processor 114, a PHY processor 116 and a HOST processor 118. These processors can be any type of integrated circuit (IC) including a general processing unit, an application specific integrated circuit (ASIC) or RISC-V based ICs, amongst others.

The memory 108 stores software including at least some functions of the MAC layer. Each processor executes software to implement the functions of the respective communication/application layer.

The PHY processor 116, in particular, includes a transmitting signal processing unit and a receiving signal processing unit and manages the interface with the wireless medium (WM). The PHY processor 116 operates on PPDUs by exchanging digital samples with the radio module which comprises the RF transmitter 102, the RF receiver 104, analog-to-digital converters and digital filters.

The MAC processor 114 executes MAC level instructions and manages the interface between the STA application software and the WM, through the PHY processor 116. The MAC processor 114 is responsible for coordinating access to the WM so that the Access Point (AP) and STAs in range can communicate effectively. The MAC processor adds header and tail bytes to units of data provided by the higher levels in the STA and sends them to the PHY layer for transmission. The reverse happens when receiving data from the PHY layer. If a frame is received in error, the MAC processor manages the retransmission of the frame.

The peripheral bus 120 connects to a number of peripherals that support core functions of the wireless device, including timers, interrupts, radio/filters/system registers, counters, UART and GPIO interfaces and others.

The HOST processor 118 interfaces with the MAC layer and is responsible for running higher level functionalities of the STA.

The PHY processor 116, the MAC processor 114, the HOST processor 118, the peripheral bus 120, memories 108 and input/output interfaces 110, communicate with each other via the bus 112. The memory 108 may further store an operating system and applications. In some embodiments, the memory may store recorded information about captured frames and packets. The input/output interface unit 110 allows for exchange of information with a user of the STA.

The antenna unit 106 can include a single antenna or multiple antennas to implement Multiple Input Multiple Output (MIMO) techniques.

Figure 1B:
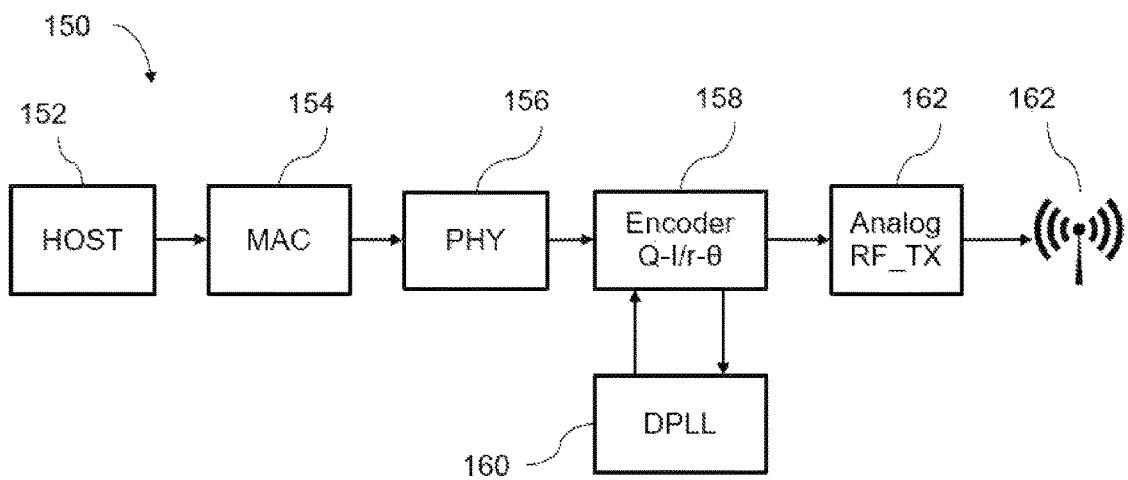
FIG. 1B shows a high-level block diagram of the data transmission chain.

FIG. 1B shows a simplified schematic block diagram of the transmitter data flow architecture 150 used to Wi-Fi packets over the wireless medium (WM). Data is generated from the host/apps module 152 and packaged in a MAC level PDU (MPDU) to be routed over the wireless network by the MAC management module 154. The PHY module 156 interfaces with the WM and compiles a PHY level PDU (PPDU) by adding a PHY preamble and tail to the MPDU. Usually a modulation coding scheme (MCS) for transmission of the packet over the medium is established using a rate control algorithm by the MAC 154 or the PHY 156. The modulation scheme selected defines the modulation technique to be used to transmit the data on the WM and the coding rate. Based on the modulation scheme selected, for example quadrature amplitude modulation (QAM), the PPDU is encoded to be transmitted on the WM. The encoder module 158 generates signals corresponding to points of a QAM constellation (see FIG. 3A) symbols (groups of bits of the PPDU) which can be encoded using polar or cartesian coordinates.

Cartesian encoding entails transmitting the in-phase (I) and in-quadrature (Q) components for a specific point on the QAM constellation. Quadrature encoding requires a linear RF power amplifier which generally requires a high-power budget to maintain linearity, this can become a problem for devices which have a limited power budget, such as battery-operated devices. In addition, a linear RF power amplifier may cause distortion and temperature sensitivity problems.

Polar encoding entails transmitting phase θ and a magnitude value r to encode each symbol of the QAM constellation. Such, type of modulation provides substantial power savings, with respect to cartesian modulation, and therefore is better suited for devices with a lower power budget.

The phase θ can be encoded by modulating the transmitted signal frequency overtime ($\delta f/\delta t$). Such modulation can be provided by linking the polar encoder 158 to the DPLL 160 and providing a DPLL that allows for fast modulation of the output signal frequency within a predefined frequency range, such as the DPLL described herein.

The modulated signals are filtered by analog filters 160 and transmitted using a transmitting antenna 162.

FIG. 2 shows a flow diagram that outlines the steps followed to maximise the DPLL output frequency dynamic range in accordance with embodiments. The method entails monitoring the output of the TCK register (202), filtering the output through an LPF filter (204) and increase or decrease the value of the ACQ register based on the monitoring of the output of the TCK register in a manner such that the target frequency resides approximately in the middle of the TCK range (206).

Figure 3A:
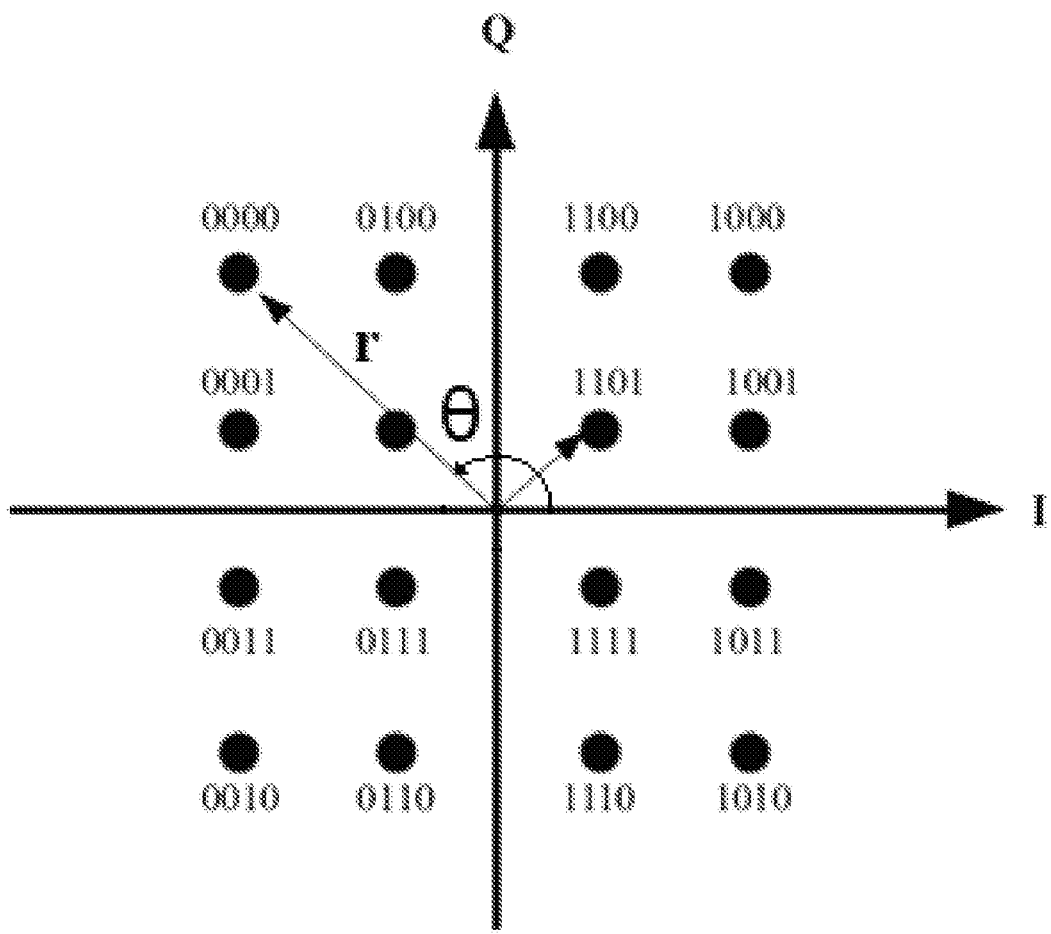
FIG. 3A shows an example of QAM modulation.

FIG. 3A shows an example of 16-QAM constellation of modulated signals. In particular, FIG. 3A shows the in-phase (I) and in-quadrature (Q) components of the modulated signals. Each signal in the constellation can be identified by its (I, Q) coordinates (cartesian modulation), or by its (r, θ) coordinates (polar modulation).

Figure 3B:
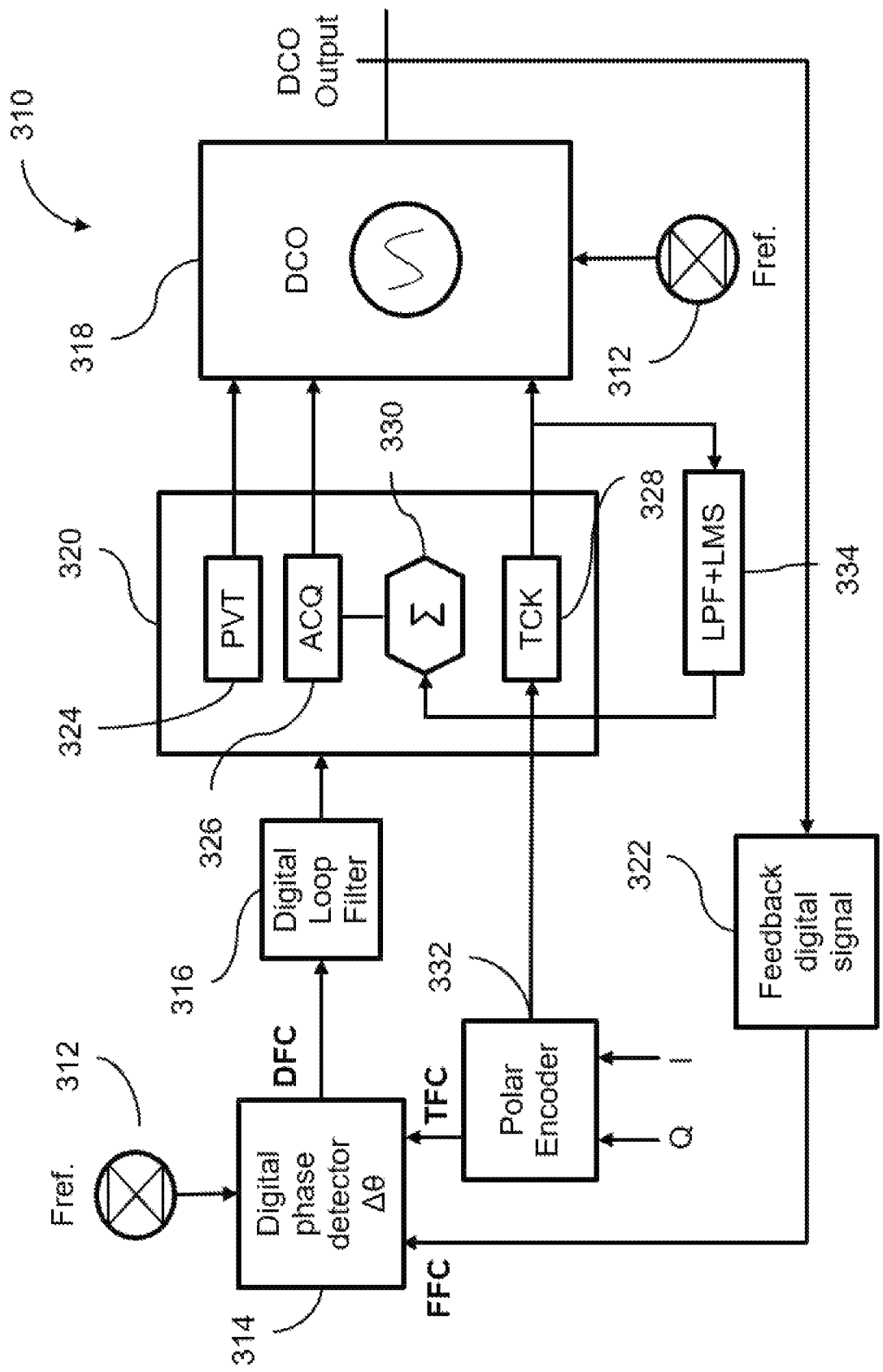
FIG. 3B shows a block diagram illustrating a DPLL circuit in accordance with embodiments.

The steps shown in FIG. 2 are implemented using the architecture of FIG. 3B, which shows a schematic block diagram of an embodiment of a digital phase locked loop (PLL) 310 that includes a reference oscillator 312, a digital phase detector 314, a digital loop filter 316, a digitally controlled oscillator (DCO) module 318, a DCO control module 320 and a feedback module 322.

In the digital PLL 310 the signal frequency is represented by digital codes. The digital phase detector 314 compares a reference digital code for the target frequency (TFC) with a digital code representing the actual DCO 318 output signal (FFC). The digital phase detector 314 produces a digital code (DFC) that is provided to the DCO control module 320 through the digital loop filter 316. In one embodiment, the DFC is a digital logic value of 1 to indicate speeding up the PLL and a logic value of 0 to indicate slowing down the PLL.

The digital loop filter 310 is coupled to process the difference signal and produce a control signal. The digital loop filter 310 can be a digital encoder that converts, for a given period of time, the difference signal into a digital value suitable for the DCO control module 320.

The DCO output frequency is controlled by three registers in the DCO control module 320. In the embodiment of FIG. 3B these three registers are named as PVT 324, acquisition ACQ 326 and tracking TCK 328. Each of the three registers comprises a digital word and controls the frequency of the output signal of the DCO with a specific resolution.

The PVT 324 is an 8-bit register used for coarse frequency control. The least significant bit (LSB) of the PVT 324 provides changes of 10 MHz to the frequency of the DCO output signal.

The ACQ 326 is an 8-bit register used for finer frequency control. The LSB of the ACQ 326 provides changes of 1 MHz to the frequency of the DCO output signal.

The TCK 328 is a 9-bit register used for precise frequency control. The LSB of the TCK 328 provides changes of 100 kHz to the frequency of the DCO output signal.

The DCO module 318 is coupled to generate an output oscillation based on the control signals from the DCO control module 320. In one embodiment, the DCO 318 includes digital circuitry to convert the digital values corresponding to the control signals of the DCO control module 320 registers (PVT, ACQ, TCK) into the output oscillation.

The feedback module 322 is arranged to convert the frequency of the actual output signal into a digital code (FFC) for comparison in the digital phase detector 314. The feedback module 322 may also use digital delay stages for synchronisation.

A reference oscillating signal 312, which may be generated using a quartz crystal, is provided to the digital phase detector 314 and the DCO module 318. A multiplier module scales the signal by a variable ratio encoded in a 32-bit digital word to generate the target DPLL output signal frequency in the digital phase detector 314. In the embodiment described the first 8 bits of the digital word correspond to the integer portion of the variable ratio and the remaining 24 bits define the decimal portion of the variable ratio. The value of the variable ratio is controlled by the polar encoder 332, which sets up the desired TFC based on the symbol being encoded on the QAM constellation.

In a state-of-the-art DPLL, the digital code DFC representing the difference between the target frequency and the output frequency drives the PLL to relock onto the desired frequency. The PVT register 324 changes value and drives large changes of the DCO output signal frequency, until the frequency is within a 10 MHz range from the target frequency. At this point, the value of the PVT is frozen and the value of the ACQ register 326 is modified until the DCO output signal frequency is brought within about 1 MHz from the desired value. At this point, the value of the ACQ register 326 is also frozen and the DCO output signal frequency is tracked with a kHz resolution by changing the value of the TCK register 328.

The frozen values of the PVT register 324 and the ACQ register 326 defined the fixed range within which the DPLL can track a signal. The size of the TCK register 328 defines the tracking resolution. If the target frequency shifts beyond the trackable range, the control module 320 unlocks the DPLL circuit and triggers a new locking cycle targeting the new target frequency. The re-locking process usually takes some time (100 μs to 300 μs) but provides stability to the PLL circuit. This time interval may be more or less relevant depending on the application and use of the PLL circuit.

The DPLL circuit proposed herein and schematically shown in FIG. 3B, is used to modulate a QAM encoded symbol using polar coordinates, as discussed with reference to FIG. 3A. The phase shift of the modulated symbol is directly linked to the frequency of the DCO output signal. In order to provide a fast frequency response of the PLL, to allow for polar modulation, the encoder 332 is directly connected to the TCK register 328 to control the DCO frequency output. In addition, the tracking range of the PLL should be maximised and kept symmetric to allow for ±180° phase modulation.

The TCK register drives changed in the capacitance values of capacitors in the DCO module 318 which, in turn, drive changes in the frequency of the DCO output signal.

In a state-of-the-art DPLL with multiple looking loops, once the outer loops are frozen, the inner tracking loop is used to track the target frequency as conditions in the circuit or device change. For example, if the temperature increases, the value of the TCK register drifts towards one edge of the range. This drift would reduce the allowable range for frequency modulation of the output and therefore the capability to use the DPLL for modulation of the output frequency, for example polar modulation.

In the DPLL design proposed herein, the target frequency (TFC) generated by the encoder 322 is sent to the digital phase comparator 314 to ensure the circuit aims to the TFC as locking frequency and, at the same time, the encoder changes the value of the TCK register 328 to obtain an immediate change of the DCO output signal frequency to allow for polar modulation.

To optimise the available modulation range, the DPLL 310 employs an additional feedback loop that, through an adder/subtractor circuit 330 and a low-pass filter and least mean square controller (LPF+LMS) 334. The adder/subtractor circuit 330 is arranged to modify the value of the ACQ register 326 when the TCK register 328 is approaching the boundary of the allowed range to keep the TCK register 328 at about middle of the tracking range.

Figure 4A:
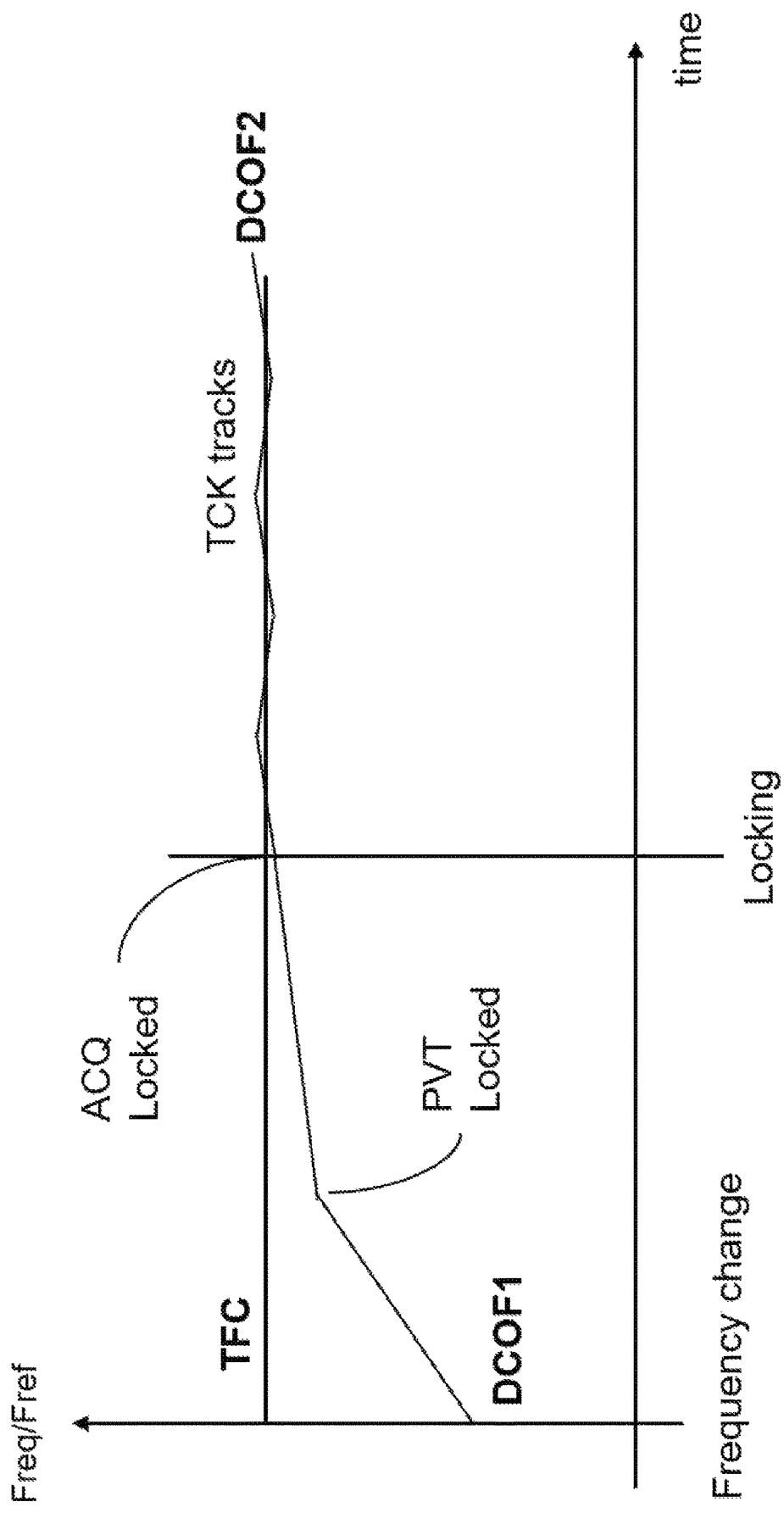
FIG. 4A shows the output frequency of the DCO (DCOF) in response to a change in the locking frequency code.

FIG. 4A shows the output frequency of the DCO (DCOF) in response to a change in the locking frequency code TFC. Upon relocking the DCOF quickly ramps towards TFC as the value of the PVT register changes until the frequency resolution of the PVT is reached and the PVT register is frozen. Subsequently, the ACQ register is ramped until the difference between DCOF2 and TFC reaches the ACQ frequency resolution, at which point the ACQ is also frozen and the TFC is tracked by changing the value of the TCK register that allows for changes of the output frequency with kHz resolution.

Changes in the conditions of the DPLL circuit may lead to changes of the value of the TCK register. For example, a drift in the circuit operating temperature may lead to a drift of the TCK value towards the upper or lower limit of the range. This would limit the capability of the DPLL to be used for fast frequency modulation and polar encoding of symbols.

Figure 3C:
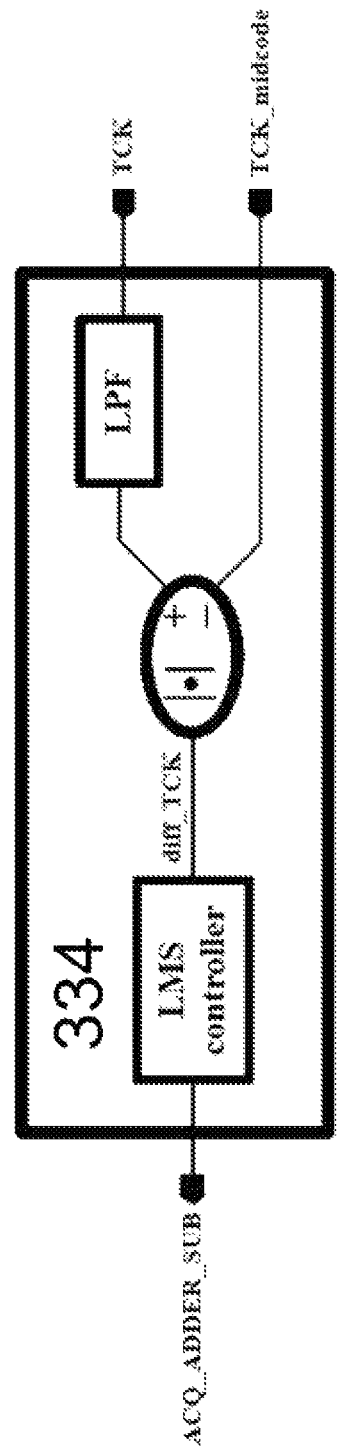
FIG. 3C shows a schematic of the second feedback loop.

The DPLL described herein, and schematically shown in FIG. 3B, comprises an additional inner loop that tracks, through LPF+LMS 334, this is shown in more detail in FIG. 3C. The changes in the TCK 328 control the value of the ACQ 326 through an adder/subtractor module 330. The hardware in the adder/subtractor module 330 allows to increase or decrease the value of the ACQ register 326, without having to go through a re-locking process. By increasing or decreasing such value, as the TCK value drifts towards the edge of its range the dynamic range of the DPLL output can be kept to its maximum.

Figure 4B:
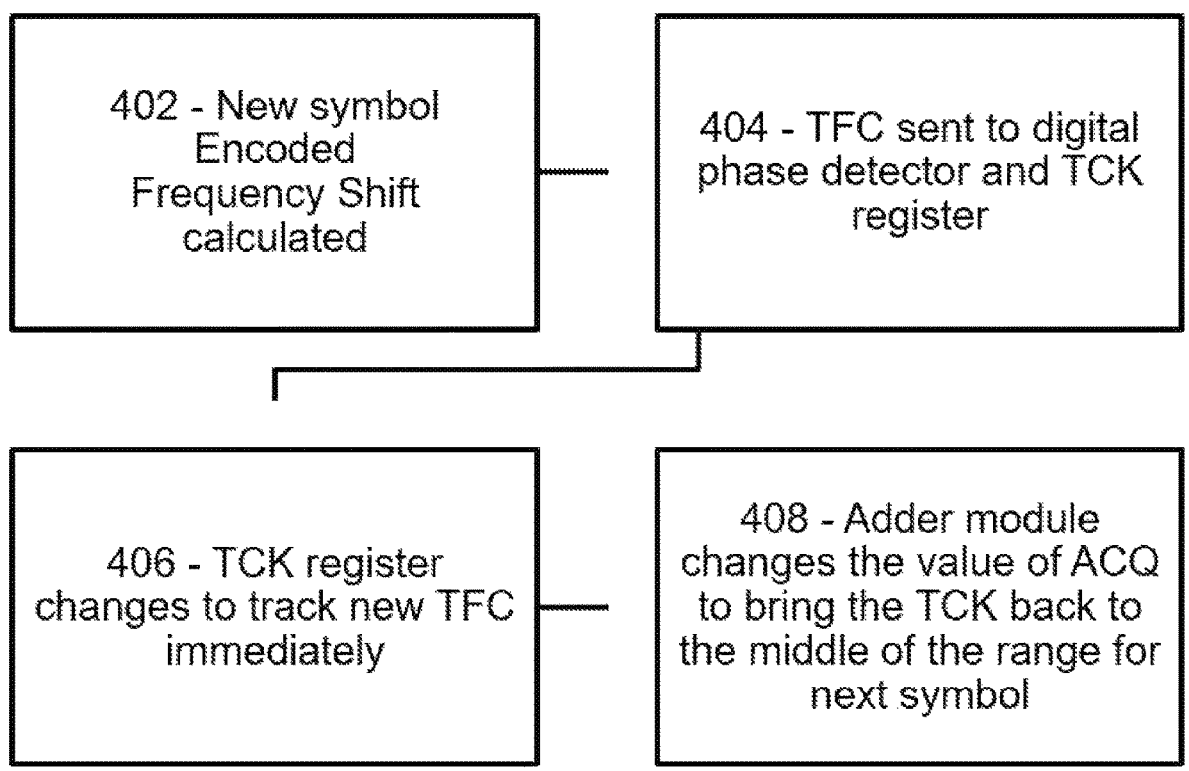
FIG. 4B schematic diagram with the high-level actions taking place in the circuit to perform polar modulation while maintaining the maximum dynamic range B.

The flow diagram in FIG. 4B shows the high-level steps taking place in the circuit to perform polar modulation while maintaining the maximum dynamic range. When a new symbol is encoded, the required frequency shift is calculated (402), the target frequency is sent to the digital phase detector and the TCK register simultaneously (404). The TCK tracks the new target frequency and induces a real time change of the frequency of the DCO output signal (406). Once the frequency has been updated, the adder module in the second feedback loop changes the value of ACQ to bring the TCK back to the middle of the range for the next symbol.

The second feedback loop may drive the adder module to make changes to the ACQ register based on an averaging algorithm performed on the values of the TCK register over time.

FIG. 3C shows more detail of the feedback block 334. The TCK code passes through a low pass filter; the difference between the low pass filtered TCK code and the TCK mid-code (TCK code at the center of the range) is calculated by a subtractor; the difference passes through an LMS controller to produce a code "ACQ_ADDER_SUB"; the ACQ_ADDER_SUB code is provided to block 330 to control the ACQ code. The aim is to minimise "diff_TCK" to be zero so that the TCK code is close to its mid-code to optimize polar modulation via polar encoder 332.

Although throughout this specification reference has been made to IEEE 802.11ah, for example to describe the PPDU and the STF and LTF fields, the invention can find application to frequency and timing estimation of any 802.11 packet type that comprises STF and LTF fields, such as 802.11ax, 802.11ac or 802.11be.

Although the invention is illustrated and described herein with reference to specific embodiments, the invention is not intended to be limited to the details shown. Rather, various modifications may be made in the details within the scope and range of equivalents of the claims and without departing from the invention.

It is to be understood that the above description is illustrative of the invention and is not to be construed as limiting the invention. Various modifications, applications and/or combinations of the embodiments may occur to those skilled in the art without departing from the scope of the invention as defined by the claims.

One having ordinary skill in the art will readily understand that the invention as discussed above may be practiced with hardware elements in configurations which are different than those which are disclosed. Therefore, although the invention has been described based upon these preferred embodiments, it would be apparent to those skilled in the art that certain modifications, variations, and alternative constructions would be apparent, while remaining within the scope of the invention.

Throughout this specification, unless the context clearly requires otherwise, the word "comprise", or variations such as "comprises" or "comprising", will be understood to imply the inclusion of a stated element, integer or step, or group of elements, integers, or steps, but not the exclusion of any other element, integer or step, or group of elements, integers, or steps.

Any discussion of documents, acts, materials, devices, articles or the like which has been included in the present specification is solely for the purpose of providing a context for the present technology. It is not to be taken as an admission that any or all these matters form part of the prior art base or were common general knowledge in the field relevant to the present technology as it existed before the priority date of each claim of this specification.

What is claimed is:

1. A digital phase-locked loop (DPLL) frequency synthesizer comprising:
    a digitally controlled oscillator (DCO) having an input and an output, the output configured to produce a signal with a frequency; a reference oscillator arranged to provide a reference frequency;
    a digital phase detector coupled to the reference oscillator to receive the reference frequency and arranged to compare a target frequency code (TFC) generated according to the reference frequency with a digital code (FFC) representing the frequency of the output of the DCO to generate a difference signal;
    a DCO control module coupled to the DCO and the digital phase detector, the DCO control module configured to receive the different signal from the digital phase detector from controlling the frequency of the output of the DCO, the DCO control module comprising a plurality of registers each arranged to control the frequency of the signal with a predetermined resolution, wherein the plurality of registers comprise a first register for precise frequency control and a second register for fine frequency control, wherein the frequency of the output of the DCO is tracked by changing a value of the first register and a value of the second register defines a tracking range for tracking the frequency of the output of the DCO;
    a first feedback loop arranged to provide a first feedback path between the output of the DCO and the digital phase detector; and
    a second feedback loop arranged to provide a second feedback path between the first register and the second register, for changing the tracking range by change a changing the value of the second register based on the value of the first register.

2. The DPLL of claim 1, further comprising a digital loop filter arranged to process the difference signal of the digital phase detector and produce a control signal for the DCO control module.

3. The DPLL of claim 1, wherein the DCO control module further comprises a PVT register for course frequency control, wherein the second register is an ACQ register and the first register is a TCK register, wherein each of the PVT register, the ACQ register, and the TCK register is configured to provide a digital word controlling the frequency of the output signal of the DCO with the predetermined resolution.

4. The DPLL of claim 3, wherein the PVT register is an 8-bit register used for coarse frequency control, the ACQ register is an 8-bit register used for fine frequency control and the TCK register is a 9-bit register used for precise frequency control.

5. The DPLL of claim 4, further comprising an adder circuit coupled to the TCK register and the ACQ register, the adder circuit being arranged to modify the value of the ACQ register when the value of the TCK register is approaching a boundary of the tracking range of defined by the value of the ACQ register in order to keep the value of the TCK register in proximity to the middle of the tracking range.

6. The DPLL of claim 1, wherein the first feedback loop comprises a feedback module coupled to the DCO and the digital phase detector for converting the frequency of the output of the DCO into the digital code (FFC) for comparison in the digital phase detector.

7. The DPLL of claim 1, further comprising a polar encoder arranged to control a value of one of the plurality of registers to directly control the frequency of the output of the DCO based on a symbol processed by polar encoding.

8. A method for performing polar modulation using a digital phase-locked loop (DPLL) frequency synthesizer comprising:
    providing a DPLL, the DPLL comprising:
        a digitally controlled oscillator (DCO) having an input and an output, the output configured to produce a signal with a frequency;
        a reference oscillator arranged to provide a reference frequency;

a digital phase detector coupled to the reference oscillator to receive the reference frequency, the digital phase detector arranged to compare a target frequency code (TFC) generated according to the reference frequency with a digital code (FFC) representing the frequency of the output of the DCO to generate a difference signal;

a DCO control module coupled to the DCO and the digital phase detector, the DCO control module configured to receive the difference signal from the digital phase detector for controlling the frequency of the output of the DCO, the DCO control module comprising a plurality of registers each arranged to control the frequency of the signal with a predetermined resolution, wherein the plurality of registers comprise a first register for precise frequency control and a second register for fine frequency control, wherein the frequency of the output of the DCO is tracked by changing a value of the first register and a value of the second register defines a tracking range for tracking the frequency of the output of the DCO;

a first feedback loop arranged to provide a first feedback path between the output of the DCO and the digital phase detector; and a second feedback loop arranged to provide a second feedback path between the first register output and the second register for changing the tracking range by changing the value of the second register based on the value of the first register;

providing a polar encoder and operatively connecting the polar encoder to the one of the plurality of registers to directly control the frequency of the output of the DCO based on a symbol processed by for polar encoding; and operatively connecting the polar encoder to the digital phase detector to provide the digital phase detector with a target frequency corresponding to the symbol, wherein the target frequency code (TFC) is generated from the target frequency according to the reference frequency.

9. The method of claim 8, wherein the first feedback loop comprises a feedback module is arranged to convert the frequency of the output of the DCO into the digital code (FFC) for comparison in the digital phase detector.

10. The method of claim 8, the DPLL further comprising a digital loop filter arranged to process the difference signal of the digital phase detector and produce a control signal for the DCO control module.

11. The method of claim 8, wherein the DCO control module further comprises a PVT register for coarse frequency control, wherein the second register is an ACQ register and the first register is a TCK register, wherein each of the PVT register, the ACQ register, and the TCK register is configured to provide a digital word controlling the frequency of the output signal of the DCO with the predetermined resolution.

12. The method of claim 11, wherein the PVT register is an 8-bit register used for coarse frequency control, the ACQ register is an 8-bit register used for fine frequency control and the TCK register is a 9-bit register used for precise frequency control.

13. The method of claim 12, wherein the second feedback loop comprises an adder circuit is arranged to modify the value of the ACQ register when the value of the TCK register is approaching a boundary of the tracking range defined by the ACQ register to keep the value of the TCK register in proximity to the middle of the tracking range.

* * * * *